United States Patent
Weng et al.

(10) Patent No.: US 9,799,585 B2
(45) Date of Patent: Oct. 24, 2017

(54) METHOD FOR FORMING A CASE FOR AN ELECTRONIC DEVICE AND MANUFACTURED CASE STRUCTURE FOR ELECTRONIC DEVICE

(71) Applicants: Inventec (Pudong) Technology Corporation, Shanghai (CN); INVENTEC CORPORATION, Taipei (TW)

(72) Inventors: Chih-Ming Weng, Taipei (TW); Yi-Lun Cheng, Taipei (TW); Chun-Lung Lin, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 865 days.

(21) Appl. No.: 14/249,084

(22) Filed: Apr. 9, 2014

(65) Prior Publication Data
US 2014/0367607 A1    Dec. 18, 2014

(30) Foreign Application Priority Data
Jun. 17, 2013    (CN) .......................... 2013 1 0239169

(51) Int. Cl.
| H01L 23/427 | (2006.01) |
| H05K 7/20 | (2006.01) |
| B29C 45/00 | (2006.01) |
| F28D 20/02 | (2006.01) |

(52) U.S. Cl.
CPC ...... *H01L 23/4275* (2013.01); *B29C 45/0001* (2013.01); *F28D 20/023* (2013.01); *H05K 7/2039* (2013.01); *H01L 2924/0002* (2013.01); *Y02E 60/145* (2013.01)

(58) Field of Classification Search
CPC ........ H01L 23/4275; H01L 2924/0002; H05K 7/2039; B29L 2031/3481; B29C 45/0001; F28D 20/023; Y02E 60/145
See application file for complete search history.

(56) References Cited

U.S. PATENT DOCUMENTS

| 8,587,945 B1 * | 11/2013 | Hartmann .......... H05K 7/20454 361/679.53 |
| 9,282,679 B2 * | 3/2016 | Ke ..................... H05K 7/20409 |

\* cited by examiner

*Primary Examiner* — Michael C Miggins
(74) *Attorney, Agent, or Firm* — Maschoff Brennan

(57) ABSTRACT

A method for forming a case for an electronic device and a manufactured case structure for an electronic device are provided. The method for forming a case for an electronic device comprises the following steps. Provide a plastic material. Provide a plurality of PCM microcapsules. Mix the plastic material and the plurality of PCM microcapsules so as to form a housing material. Form a case from the housing material by injection molding. The manufactured case structure for an electronic device comprises a plastic layer and a plurality of PCM microcapsules. The plurality of PCM microcapsules are dispersed in the plastic layer.

6 Claims, 2 Drawing Sheets

METHOD FOR FORMING A CASE FOR AN ELECTRONIC DEVICE AND MANUFACTURED CASE STRUCTURE FOR ELECTRONIC DEVICE

CROSS-REFERENCE TO RELATED APPLICATIONS

This non-provisional application claims priority under 35 U.S.C. §119(a) on Patent Application No(s). 201310239169.8 filed in China on Jun. 17, 2013, the entire contents of which are hereby incorporated by reference.

BACKGROUND OF THE INVENTION

Technical Field of the Invention

The disclosure relates to a method for forming a case for an electronic device and a manufactured case structure for an electronic device, and more particularly, to a method for forming a case and a manufactured case structure for an electronic device by using phase change material (PCM) microcapsules.

Description of the Related Art

With the improvement of technologies, the market for electronic devices (e.g. notebooks, portable mobile phones, tablet computers, electronic dictionaries, or portable electronic gaming machines) has become more and more competitive. In order to meet the consumers' needs, the industry has invested a lot of money for researching. With the improvement of the performance of electronic devices, electronic devices are producing more and more heat while working. In order to improve heat dissipation of electronic devices, aluminum foils or graphene sheets are usually attached to the plastic case, so as to dissipate the heat. However, the process needs to be done after the manufacturing of the plastic cases, and the process increases the producing cost of the cases. On the other hand, different cases usually have different sizes, so that one size of the aluminum foils or the graphene sheets can not be attached uniformly on cases with different sizes, as well the heat dissipation is affected. Therefore, how to design a method for forming a case and the case structure thereof, so as to solve the problems met in prior art that the manufacturing of the cases is complicated and the heat dissipation of the manufactured case structures is not desirable, has become the problems designers need to solve.

SUMMARY OF THE INVENTION

According to an embodiment, a method for forming a case for an electronic device is disclosed. The method comprises the following steps. Provide a plastic material. Provide a plurality of phase change material (PCM) microcapsules. Mix the plastic material and the plurality of PCM microcapsules so as to form a housing material. Form a case for an electronic device from the housing material by injection molding.

According to an embodiment, a case structure for an electronic device is disclosed. The case structure for an electronic device comprises a plastic layer and a plurality of PCM microcapsules. The PCM microcapsules are dispersed in the plastic layer.

BRIEF DESCRIPTION OF THE DRAWINGS

The present disclosure will become more fully understood from the detailed description given herein below for illustration only, thus does not limit the present disclosure, wherein.

DETAILED DESCRIPTION

Figure 1:
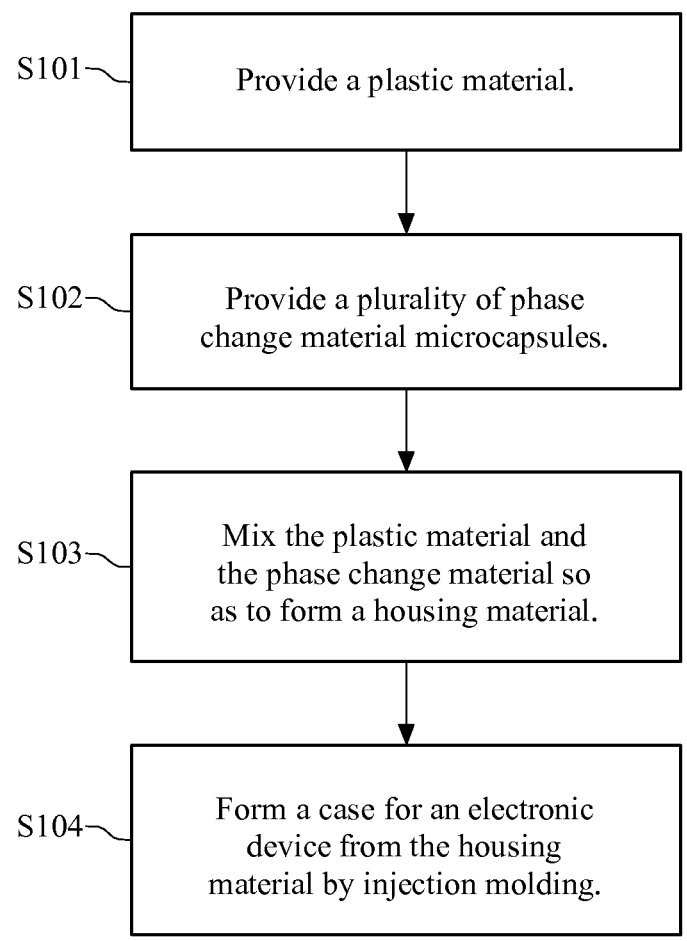
FIG. 1 is a flow chart of a method for forming a case for an electronic device according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
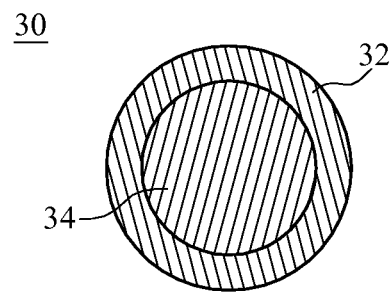
FIG. 2 is a sectional view of a PCM microcapsule in Step 102 of FIG. 1.
Figure 3:
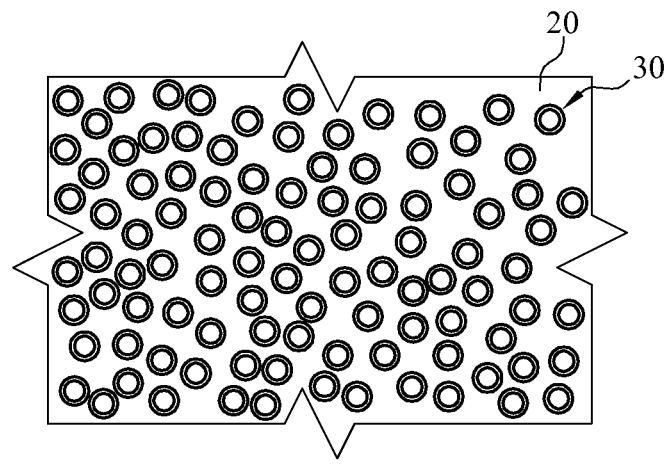
FIG. 3 is a schematic diagram of a housing material in Step 103 of FIG. 1.

Please refer to FIGS. 1-3, FIG. 1 is a flow chart of a method for forming a case for an electronic device according to an embodiment of the disclosure, FIG. 2 is a sectional view of a phase change material (PCM) microcapsule in Step 102 of FIG. 1, and FIG. 3 is a schematic diagram of a housing material in Step 103 of FIG. 1.

First, provide a plastic material (Step 101). In this embodiment, the plastic material is polycarbonate/acrylonitrile-butadiene-styrene (PC/ABS), but the disclosure is not limited thereto.

Then, provide a plurality of PCM microcapsules (Step 102) (as shown in FIG. 2). In this embodiment, each of the PCM microcapsules 30 comprises a capsule shell 32 and a capsule core 34. The capsule core 34 is enclosed by the capsule shell 32. Wherein, the material of the capsule shell 32 is a polymer, and the material of the capsule core 34 comprises a phase change material. The melting point of the phase change material is between 20° C. and 75° C., preferably, between 35° C. and 55° C. In this embodiment, the material of the capsule shell 32 comprises a mixture of polycarbonate (PC) and glass fiber (GF). In this and some other embodiments, the mass percentage of glass fiber (GF) in the capsule shell 32 is between 35% and 45%, preferably, 40%. Furthermore, the material of the capsule core 34 comprises a phase change material. The phase change material is a heat absorbing substance, for example, paraffin wax, alkanes (e.g. icosane to triacontane), alcohols (e.g. decan-1-ol to icosane-1-ol), and acids (e.g. decanoic acid to icosanoic acid). However, the material and the composition of the capsule shell 32 and the capsule core 34 are not limited to the disclosure. In this embodiment, the diameter of the PCM microcapsules is between 0.1 and 1000 micrometers (μm), preferably, between 10 and 30 micrometers, and more preferably, between 20 and 30 micrometers.

In this and other embodiments, the material of the capsule shell 32 corresponds to the plastic material. More specifically, the melting point of the capsule shell 32 is higher than the melting point of the plastic material. For example, in this embodiment, the melting point of the capsule shell 32 (PC/GF) is about 285° C., and the melting point of the plastic material (PC/ABS) is about 230° C.

Afterwards, mix the plastic material and the phase change material so as to form a housing material (Step 103) (as shown in FIG. 3). The volume ratio of the plastic material to the PCM microcapsules is between 4:1 and 99:1, preferably, 4:1 to 9:1. In this embodiment, the plastic material 20 and the PCM microcapsules 30 are mixed with the volume ratio of 4:1, but the disclosure is not limited thereto. A user can adjust the volume ratio of the plastic material 20 and the PCM microcapsule 30 according to his/her need. After the mixing process of Step 103, the PCM microcapsules 30 are dispersed uniformly in the plastic material 20.

Finally, form a case for an electronic device from the housing material by injection molding (Step 104). In detail, the housing material passes through a machine for injection molding (not shown), and the housing material is molded to form a case for an electronic device under a reaction temperature. In this and other embodiments, when the housing material passes through the machine for injection molding, the reaction temperature is lower than the melting point of the capsule shell of the PCM microcapsules, as well as the reaction temperature is higher than the melting point of the plastic material. Therefore, the plastic material is liquefied during the reaction because of the high temperature, so that the user can mold the plastic material to the designed shape according to his/her need. Furthermore, the capsule shell keeps in a solid phase and restricts the capsule core enclosed by the capsule shell during the reaction.

Figure 4:
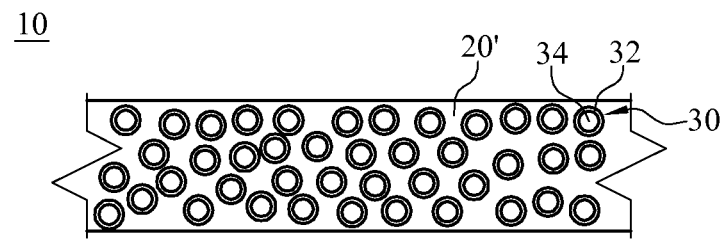
FIG. 4 is a sectional view of part of the structure of a case structure for an electronic device formed according to the method of FIG. 1.

Please refer to FIG. 4, FIG. 4 is a sectional view of part of the structure of a case structure for an electronic device formed according to the method of FIG. 1. The formed case structure 10 for an electronic device comprises a plastic layer 20' and a plurality of PCM microcapsules 30. The PCM microcapsules 30 are dispersed uniformly in the plastic layer 20'. In detail, each of the PCM microcapsules 30 has a capsule shell 32 and a capsule core 34, and the capsule core 34 is enclosed by the capsule shell 32. Wherein, the material and composition of the capsule shell 32 and the capsule core 34 are described above.

Since the case structure for an electronic device 10 comprises a plurality of PCM microcapsules 30, the material of the capsule core 34 in the PCM microcapsules 30 is a phase change material, as well, the phase change material has high latent heat, therefore, when electronic units produce a great amount of heat and the heat is delivered to the case structure 10 for an electronic device, the phase change material absorbs and stores the heat so as to proceed a phase transition. Temperature is kept in a range during the phase transition, as well; the temperature is controlled by adjusting the capsule core 34 of the PCM microcapsules 30. Therefore, the phase change material slows down the rising of the temperature, as well as improving the heat dissipation of the case structure 10 for an electronic device. Further, heat dissipation of the surface of the case structure 10 for an electronic device is controlled and the temperature of the surface of the case structure 10 for an electronic device is maintained in thermostatic.

According to the method for forming a case for an electronic device and the manufactured case structure for an electronic device of the disclosure, the plastic material is mixed with the PCM microcapsules and forms the case structure for electronic device by injection molding. Therefore, the manufactured case structure for an electronic device does not need further machining, and the process is simplified. Furthermore, the case structure for electronic device absorbs heat by the PCM microcapsules, so that the heat dissipation of the case structure for an electronic device is better. Therefore, the problems met in prior art that the manufacturing of the cases is complicated and the heat dissipation of the manufactured case structures is not desirable have been solved.

The embodiments were chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A method for forming a case for an electronic device, comprising:
   providing a plastic material;
   providing a plurality of phase change material (PCM) microcapsules;
   mixing the plastic material and the plurality of PCM microcapsules so as to form a housing material; and
   forming a case for an electronic device from the housing material by injection molding,
   wherein each of the plurality of PCM microcapsules comprises a capsule shell and a capsule core, the capsule core is enclosed by the capsule shell, the material of the capsule shell is a polymer, the material of the capsule core comprises a phase change material, and a melting point of the phase change material is between 20° C. and 75° C., and
   wherein the melting point of the capsule shell of the plurality of PCM microcapsules is higher than the melting point of the plastic material.

2. The method for forming a case for an electronic device according to claim 1, wherein the housing material forms the case for an electronic device by injection molding under a reaction temperature, the reaction temperature is lower than the melting point of the capsule shell of the plurality of PCM microcapsules, the reaction temperature is higher than the melting point of the plastic material.

3. The method for forming a case for an electronic device according to claim 1, wherein in the steps of mixing the plastic material and the plurality of PCM microcapsules so as to form the housing material, the volume ratio of the plastic material to the plurality of PCM microcapsules is between 4:1 and 99:1.

4. A case structure for an electronic device, comprising:
   a plastic layer; and
   a plurality of PCM microcapsules, dispersing in the plastic layer,
   wherein each of the plurality of PCM microcapsules comprises a capsule shell and a capsule core, the capsule core is enclosed by the capsule shell, the material of the capsule shell is a polymer, the material of the capsule core comprises a phase change material, and a melting point of the phase change material is between 20° C. and 75° C., and
   wherein the melting point of the capsule shell of the plurality of PCM microcapsules is higher than the melting point of the plastic layer.

5. The case structure for an electronic device according to claim 4, wherein the material of the capsule shell of the plurality of PCM microcapsules comprises a polycarbonate and a glass fiber.

6. The case structure for an electronic device according to claim 4, wherein the volume ratio of the plastic layer to the plurality of PCM microcapsules is between 4:1 and 99:1.

* * * * *